United States Patent
Du

(10) Patent No.: US 11,289,685 B2
(45) Date of Patent: Mar. 29, 2022

(54) DISPLAY PANEL WITH PATTERNED LIGHT ABSORBING LAYER, AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Yanying Du, Shenzhen (CN)

(*) Notice: Subject to any disclaimer, the term of this patent is extended or adjusted under 35 U.S.C. 154(b) by 167 days.

(21) Appl. No.: 16/623,788

(22) PCT Filed: Nov. 20, 2019

(86) PCT No.: PCT/CN2019/119767
§ 371 (c)(1),
(2) Date: Dec. 18, 2019

(87) PCT Pub. No.: WO2021/088131
PCT Pub. Date: May 14, 2021

(65) Prior Publication Data
US 2021/0343990 A1 Nov. 4, 2021

(30) Foreign Application Priority Data
Nov. 8, 2019 (CN) .......................... 201911090403.9

(51) Int. Cl.
*H01L 51/52* (2006.01)
*H01L 27/32* (2006.01)
*H01L 51/56* (2006.01)

(52) U.S. Cl.
CPC ...... *H01L 51/5284* (2013.01); *H01L 27/3246* (2013.01); *H01L 51/56* (2013.01);
(Continued)

(58) Field of Classification Search
USPC ........................................... 257/40
See application file for complete search history.

(56) References Cited

U.S. PATENT DOCUMENTS 6,855,960 B2 2/2005 Park et al.
7,321,405 B2 1/2008 Park et al.
(Continued)

FOREIGN PATENT DOCUMENTS

CN 1452252 A 10/2003
CN 104282719 A 1/2015

*Primary Examiner* — Nduka E Ojeh

(57) ABSTRACT

The present invention provides a display panel and a manufacturing method thereof. The present invention decreases reflection of external light on the display by an amorphous silicon film layer absorbing light. The light absorbing layer is disposed on the first electrode, and employs the pattern of the pixel definition layer to form a mask plate. A through hole is defined in a light emitting region of the pixel definition layer, and is defined through the light absorbing layer such that the first electrode is exposed in the through hole. The light absorbing layer of the displaying region is removed when the through hole is etched such that the light absorbing layer only exists in the non-displaying region. The effective first electrode structure has no overlapping region with the light absorbing layer such that an excellent pixel electrode pattern and the light absorbing layer covering the non-light emitting region both exists.

2 Claims, 8 Drawing Sheets

(52) U.S. Cl.
CPC ........ *H01L 27/3262* (2013.01); *H01L 51/525* (2013.01); *H01L 2227/323* (2013.01)

(56) References Cited

U.S. PATENT DOCUMENTS

| | | |
|---|---|---|
| 9,515,291 B2 | 12/2016 | Kudo et al. |
| 10,020,467 B2 | 7/2018 | Kudo et al. |
| 10,243,170 B2 | 3/2019 | Kudo et al. |
| 10,541,383 B2 | 1/2020 | Kudo et al. |
| 2018/0011385 A1* | 1/2018 | Kang ................. H01L 27/3246 |
| 2018/0097192 A1* | 4/2018 | Mishima ............. H01L 51/5092 |
| 2018/0366565 A1* | 12/2018 | Chen ................. H01L 29/66969 |
| 2019/0165065 A1* | 5/2019 | Kong ................. H01L 27/322 |
| 2020/0152917 A1 | 5/2020 | Kudo et al. |

* cited by examiner

DISPLAY PANEL WITH PATTERNED LIGHT ABSORBING LAYER, AND MANUFACTURING METHOD THEREOF

FIELD OF INVENTION

The present invention relates to a field of display, especially to a display panel and a manufacturing method thereof.

BACKGROUND OF INVENTION

Active matrix organic light emitting diode (OLED) display panels are currently widely used as a display technology with many advantages such as self-illumination, high brightness, high contrast, wide viewing angle, fast response, low power consumption, and light weight, which are deemed as a display technology of the next generation. Such technology is widely used in electronic terminal products, home appliances, automotive and other fields. When applied to terminal products such as handheld devices, handheld devices have higher requirements for display effect under natural light due to the possibility of application scenarios in various situations.

SUMMARY OF INVENTION

Technical Issue

Because at present light emitting efficiency of an organic light emitting diode (OLED) is low, under consideration of balance of power consumption, high contrast effect performed by high brightness under strong external light is difficult to achieve. Due t existence of reflection of external light, human eyes are influenced by reflective light when the OLED displays, which affects actual display effect of the OLED. At the present, usually a circular polarizer is adopted such that incident light cannot be emitted out again to reduce the influence. However, employment of the additional polarizer, in one aspect increases a thickness of the display and sacrifices flexibility thereof, and in another aspect increases the cost and lowers the yield rate due to adoption of additional manufacturing process steps.

Therefore, providing a new display panel is urgently required to reduce influence of external light to the display panel and to improve display effect of the display panel.

Technical Solution

An objective of the present invention is to provide a display panel and a manufacturing method thereof, by manufacturing a light absorbing layer that absorbs visible light, reduces reflection of external light on the display, and enhances display effect of the display panel.

For achievement of the above objective, the present invention provides a display panel comprising: an underlay substrate comprising a displaying region and a non-displaying region; a thin film transistor layer disposed on the underlay substrate and corresponding to the non-displaying region; a first electrode disposed on the thin film transistor layer and corresponding to the displaying region, and the first electrode connected to the thin film transistor layer; a light absorbing layer disposed on the thin film transistor layer and corresponding to the non-displaying region; a pixel definition layer disposed on the light absorbing layer, and the pixel definition layer comprising a first through hole corresponding to the displaying region, and the first through hole defined through the pixel definition layer and extending to a surface of the first electrode; and an organic light emitting layer disposed in the first through hole and connected to the first electrode.

Furthermore, the light absorbing layer is also disposed on the first electrode; and the first through hole is defined through the pixel definition layer and through the light absorbing layer and extends to the surface of the first electrode.

Furthermore, material of the light absorbing layer comprises indium gallium zinc oxide, indium aluminum zinc oxide, or polycrystalline silicon.

Furthermore, an interval is defined between the light absorbing layer and the first electrode.

Furthermore, material of the light absorbing layer comprises indium tin oxide.

Furthermore, the first electrode comprises: a first transparent electrode layer; a metal layer disposed on a side of the first transparent electrode layer; a second transparent electrode layer disposed on a side of the metal layer away from the first transparent electrode layer.

Furthermore, the first transparent electrode layer and the light absorbing layer are disposed in a same layer.

The present invention provides a display panel manufacturing method, comprising: providing an underlay substrate, wherein the underlay substrate comprises a displaying region and a non-displaying region; forming a thin film transistor layer, which corresponds to the non-displaying region, on the underlay substrate; forming a first electrode, which corresponds to the displaying region, on the thin film transistor layer; forming a light absorbing layer on the thin film transistor layer and on the first electrode; forming a pixel definition layer on the light absorbing layer; forming a through hole, which corresponds to the displaying region, in the pixel definition layer; etching a portion of the light absorbing layer corresponding to the through hole such that the first electrode is exposed in the through hole; and vapor-depositing an organic light emitting layer on the first electrode in the through hole.

The present invention also provides a display panel manufacturing method, comprising: providing an underlay substrate, wherein the underlay substrate comprises a displaying region and a non-displaying region; forming a thin film transistor layer, which corresponds to the non-displaying region, on the underlay substrate; sequentially depositing a light absorbing layer, a metal layer, and a second transparent electrode layer on the thin film transistor layer; patterning the light absorbing layer, the metal layer, and the second transparent electrode layer by using a semi-exposure technique to form a first electrode in the displaying region, and to form an interval in the light absorbing layer, wherein the interval is defined between the displaying region and the non-displaying region; forming a pixel definition layer on the light absorbing layer; forming a first through hole, which corresponds to the displaying region, on the pixel definition layer; etching a portion of the light absorbing layer corresponding to the first through hole such that the first electrode is exposed in the first through hole; and vapor-depositing an organic light emitting layer on the first electrode in the first through hole.

Furthermore, the step of patterning the light absorbing layer, the metal layer, and the second transparent electrode layer by using the semi-exposure technique, specifically comprises: providing a halftone mask plate, wherein the halftone mask plate comprises a fully through hole, a semi-light transmissive region, and an opaque region; coating a photoresist layer on the second transparent electrode layer; exposing and developing the photoresist layer by the halftone mask plate to acquire a first electrode pattern, a light absorbing layer pattern, and an intervening pattern; etching the light absorbing layer, the metal layer, and the second transparent electrode layer corresponding to the intervening pattern to form an interval; removing the light absorbing layer pattern, and etching the metal layer and the second transparent electrode layer in the non-displaying region to expose the light absorbing layer in the non-displaying region; and removing the first electrode pattern to acquire the first electrode.

Advantages

The present invention provides a display panel and a manufacturing method thereof. The present invention decreases reflection of external light on the display by manufacturing an amorphous silicon film layer able to absorb visible light. The light absorbing layer is preferably disposed on the first electrode, and employs the inherent pattern of the pixel definition layer to form a mask plate, in other words, a through hole is defined in a light emitting region of the pixel definition layer, and the through hole is defined through the light absorbing layer such that the first electrode is exposed in the through hole. Thus, the exposed first electrode in the through hole is an effective electrode. Further, the light absorbing layer of the displaying region is removed when the through hole is etched such that the light absorbing layer only exists in the non-displaying region. Therefore, the effective first electrode structure has no overlapping region with the light absorbing layer such that an excellent pixel electrode pattern and the light absorbing layer completely covering the non-light emitting region can both exist.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

Figure 1:
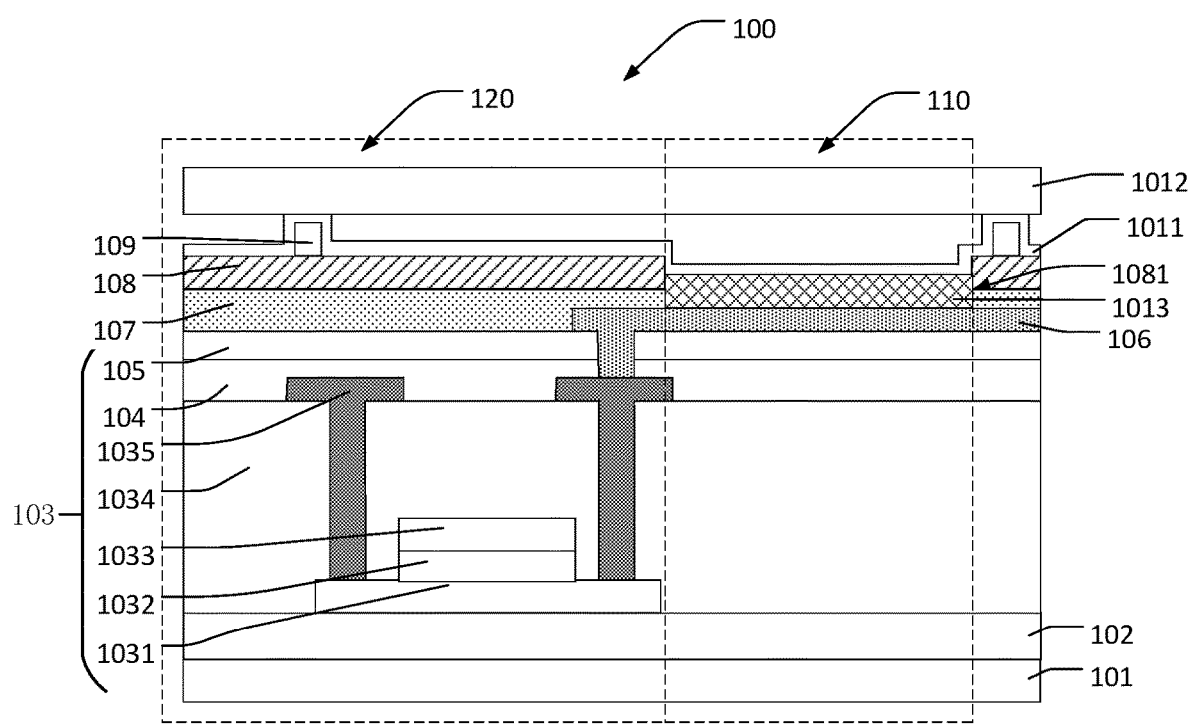
FIG. 1 is a schematic structural view of a display panel of an embodiment of the present invention.

display panel 100; displaying region 110; non-displaying region 120;

underlay substrate 101; buffer layer 102; thin film transistor layer 103;

first electrode 106; light absorbing layer 107; pixel definition layer 108;

organic light emitting layer 1013; active layer 1031; gate insulation layer 1032;

gate electrode layer 1033; dielectric layer 1034; source and drain electrode layer 1035;

passivation layer 104; planarization layer 105; first transparent electrode layer 1061;

metal layer 1062; second transparent electrode layer 1063; supporting columns 109;

second electrode 1011; encapsulation cover plate 1012; first through hole 1081.

DETAILED DESCRIPTION OF PREFERRED EMBODIMENTS

The following is a description of each embodiment with reference to an additional drawing to illustrate the specific embodiment. The directional terms mentioned in the present invention, for example, up, down, front, back, left, right, inside, outside, side, etc., only refer to the direction of the drawing. The name of the element mentioned in the present invention, such as first, second, etc., are only configured for distinguishing different components. In the drawings, similar structure are indicated by the same reference numerals.

The present specification will describe embodiments of the present invention in details by referring to the accompanying drawings. the present invention can be presented in many different ways, and the present invention should not be explained as specific embodiments as described in the present specification. the present invention provides the embodiments for explanation of actual applications for the present invention such that a person having ordinary skill in the art can understand various embodiments of the present invention and various modification solutions suitable for expected applications.

With reference to FIG. 1, the present invention provides a display panel 100 of an embodiment comprising: an underlay substrate 101, a thin film transistor layer 103, a first electrode 106, a light absorbing layer 107, a pixel definition layer 108, and an organic light emitting layer 1013.

The underlay substrate 101 comprises a displaying region 110 and a non-displaying region 120. A buffer layer 102 is disposed between the underlay substrate 101 and the thin film transistor layer 103, and the buffer layer 102 is configured to protect the thin film transistor layer 103.

The displaying region 110 is configured to emit light and display, the non-displaying region 120 is configured to be disposed with metal wires.

Material of the underlay substrate 101 comprises glass, ceramic, alloy. etc.

The thin film transistor layer 103 is disposed on the underlay substrate 101 and corresponds to the non-displaying region 120.

The thin film transistor layer 103 comprises: an active layer 1031, a gate insulation layer 1032, a gate electrode layer 1033, dielectric layer 1034, a source and drain electrode layer 1035, passivation layer 104, and a planarization layer 105.

The active layer 1031 is disposed on a side of the insulation layer away from the underlay substrate 101. The gate insulation layer 1032 is disposed on a side of the active layer 1031 away from the buffer layer 102. The gate electrode layer 1033 is disposed on a side of the gate insulation layer 1032 away from the active layer 1031. The dielectric layer 1034 is disposed on the buffer layer 102, the active layer 1031, and the gate electrode layer 1033.

The source and drain electrode layer 1035 is disposed on a side of the dielectric layer 1034 away from the buffer layer 102, and the source and drain electrode layer 1035 is connected to the active layer 1031.

The passivation layer 104 is disposed on the source and drain electrode layer 1035 and the dielectric layer 1034. The planarization layer 105 is disposed on a side of the passivation layer 104 away from the dielectric layer 1034, and is configured to raise flatness of the thin film transistor layer 103.

The first electrode 106 is disposed on the thin film transistor layer 103 and corresponds to the displaying region 110. The first electrode 106 is connected to the thin film transistor layer 103. The thin film transistor layer 103 is configured to control the first electrode 106.

Figure 2:
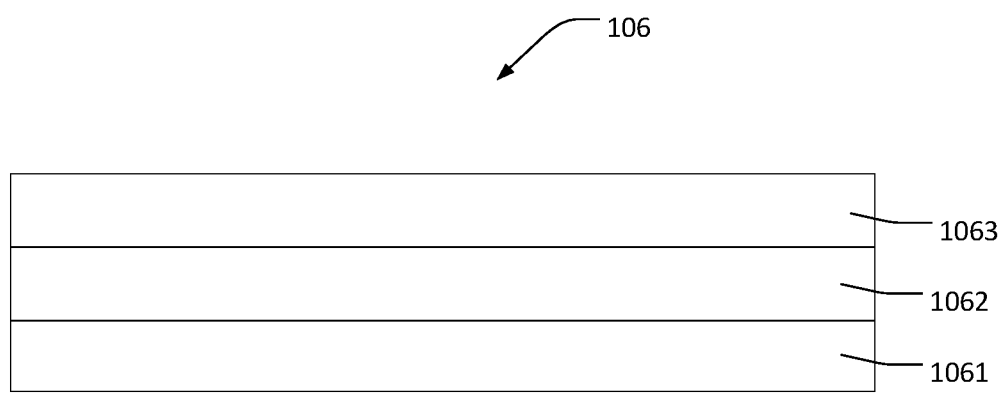
FIG. 2 is a schematic structural view of a first electrode of an embodiment provided by the present invention.

With reference to FIG. 2, the first electrode 106 comprises: a first transparent electrode layer 1061, a metal layer 1062, and a second transparent electrode layer 1063.

The metal layer 1062 is disposed on a side of the first transparent electrode layer 1061. The second transparent electrode layer 1063 is disposed on a side of the metal layer 1062 away from the first transparent electrode layer 1061.

With reference to FIG. 1 again, the first electrode 106 is an anode, and the first electrode 106 is specifically connected to the source and drain electrode layer 1035.

The light absorbing layer 107 is disposed on the thin film transistor layer 103 and the first electrode 106. Material of the light absorbing layer 107 comprises indium gallium zinc oxide, indium aluminum zinc oxide, or polycrystalline silicon.

The light absorbing layer 107 can absorb external light, lower reflection of incident light, and effectively mitigate influence of strong external light to display effect, which further improves the display effect of the display panel 100.

The pixel definition layer 108 is disposed on the light absorbing layer 107, the pixel definition layer 108 and comprises a first through hole 1081 corresponding to the displaying region 110. The first through hole 1081 is defined through a pixel definition layer 108 and extend to a surface of the first electrode 106.

The organic light emitting layer 1013 is disposed in the first through hole 1081 and is connected to the first electrode 106.

The organic light emitting layer 1013 comprises a single layer device, double layer device, triple layer device, and multi-layer device.

The single layer device is an organic layer capable of emitting diode, which is directly connected. In such structure, because of injection of electrons and holes and non-balance of transport, the device efficiency and brightness are low and stability of the device is poor.

The double layer device, on the basis of the single layer device, a hole transport layer (HTL) or an electron transport layer (ETL) is added on two sides of the light emitting layer to overcome an issue of non-balance of carrier injection of the single layer device, which improves characteristics of voltage-current of the device and enhances light emitting efficiency of the device.

The triple layer device structure is a structure used most extensively, and is also a preferred structure of the present embodiment, which primarily adds a hole transport layer (HTL) or an electron transport layer (ETL) on two sides of a light emitting layer. An advantage of such structure is limiting excitors in the light emitting layer to improve efficiency of the device.

The multi-layer device is a structure with a better performance, which can excellent perform functions in various aspects. The light emitting layer can also be constructed by layers. Because the organic layers are individual to one another, they can be optimized separately. Therefore, such structure can fully perform functions of each organic layer, which extremely improves flexibility of designs of the device.

With reference to FIG. 1 again, the display panel 100 further comprises supporting columns 109, a second electrode 1011, and an encapsulation cover plate 1012.

The supporting columns 109 are disposed on the pixel definition layer 108. The supporting columns 109 and the pixel definition layer 108 are both made of polyimide or the like with similar performance. During the manufacturing, patterns can be formed by different steps, or exposure, development and etching technologies with a halftone mask plate can be used to form patterns of the supporting columns 109 disposed on the pixel definition layer 108 at one time.

The second electrode 1011 is disposed on the supporting columns 109, the pixel definition layer 108, and the organic light emitting layer 1013. The second electrode 1011 is a cathode, and can employs light transmissive electrode comprising Ag, Mg, Al, and IZO.

The encapsulation cover plate 1012 is disposed on the second electrode 1011 corresponding to the supporting columns 109. The encapsulation cover plate 1012 can be adhered to and sealed on underlay substrate 101 by an ultra violet curing adhesive or thermal curing adhesive, or alternatively by a laser sintering process with glass material. Simultaneously, a thin film encapsulation process is used as a replacement for the cover plate and the sealant.

In an embodiment, the light absorbing layer 107 can also be disposed on or under the supporting columns 109, the pixel definition layer 108, the planarization layer 105, and the passivation layer 104, and should at least be disposed on the source and drain electrode layer of the thin film transistor layer 103.

The present embodiment preferably disposes the light absorbing layer 107 on the first electrode 106. Because when the external light absorbing layer 107 is manufactured by using non-conductive material, an inherent pattern of the pixel definition layer 108 can be used to form a mask plate, in other words a through hole is defined in the light emitting region of the pixel definition layer 108, the through hole is defined through light absorbing layer 107, this makes the first electrode exposed in the through hole. The first electrode exposed in the through hole is an effective electrode, and the light absorbing layer 107 of the displaying region 110 is removed such that the light absorbing layer 107 only exists in the non-displaying region 120. Therefore, the effective electrode structure does not exist in an overlapping region with the light absorbing layer 107 such that both the excellent pixel electrode pattern and the light absorbing layer 107 fully covering the non-light emitting region exist.

Furthermore, the supporting columns 109 and the pixel definition layer 108 have a certain refractive index, and therefore have a certain reflection such that the light absorbing layer 107 can be formed on the supporting columns 109 to completely avoid reflection of backplate, and even can formed on the encapsulation layer to completely avoid reflection of the non-light emitting region of the display panel 100. However, under consideration of assurance of production quality, the light absorbing layer 107 is formed under the supporting columns 109 to prevent later influence of the film layer worn due to the supporting columns 109 performing cushion functions to the device of the display panel 100.

To acquire a display panel 100 of an embodiment of the present invention, the present invention provides a display panel manufacturing method of an embodiment, comprising steps S1) to S9) as follows.

The step S1) comprises providing an underlay substrate 101. The underlay substrate 101 comprises a displaying region 110 and a non-displaying region 120.

The step S2) comprises forming a thin film transistor layer 103, which corresponds to the non-displaying region 120, on the underlay substrate 101.

The step S3) comprises forming a first electrode 106, which corresponds to the displaying region 110, on the thin film transistor layer 103.

The step S4) comprises forming a light absorbing layer 107 on the first electrode 106 and on the thin film transistor layer 103.

The step S5) comprises forming a pixel definition layer 108 on the light absorbing layer 107.

The step S6) comprises forming supporting columns 109 on the pixel definition layer 108. The step S6) can be implemented simultaneously with the step S5). By employing exposure, development and etching technologies with a halftone mask plate, the pattern of the supporting columns 109 disposed on the pixel definition layer 108 at one time.

The step S7) comprises forming a first through hole 1081, which corresponds to the displaying region 110, on the pixel definition layer 108.

The step S8) comprises etching a portion of the light absorbing layer 107 corresponding to the through hole such that the first electrode 106 is exposed in the through hole. In the step S8), by using the pattern of the pixel definition layer 108 (i.e., first through hole 1081) to etch the light absorbing layer 107, the effective first electrode is exposed in the first through hole 1081, and thus the light absorbing layer 107 only exists in the non-displaying region 120. Therefore, the structure of the effective first electrode has no overlapping region with light absorbing layer 107 such that both the excellent pixel electrode pattern and the light absorbing layer 107 fully covering the non-light emitting region exist.

The step S9) vapor-depositing an organic light emitting layer 1013 on the first electrode 106 in the first through hole 1081.

Figure 3:
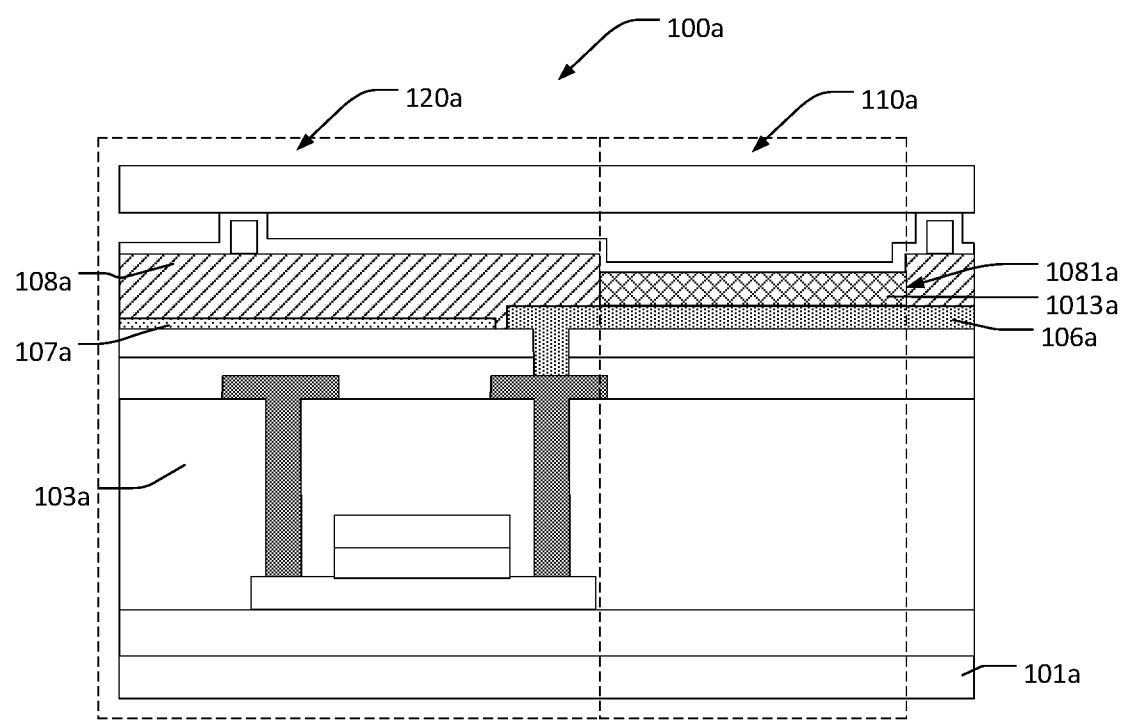
FIG. 3 is a schematic structural view of a display panel of another embodiment provided by the present invention.

With reference to FIG. 3, the present invention also provides a display panel 100a of another embodiment, and a difference of the embodiment from the former embodiment is that an interval is defined between the light absorbing layer 107a and the first electrode 106a such that the light absorbing layer 107a is not connected to or does not block the first electrode 106a.

Figure 8:
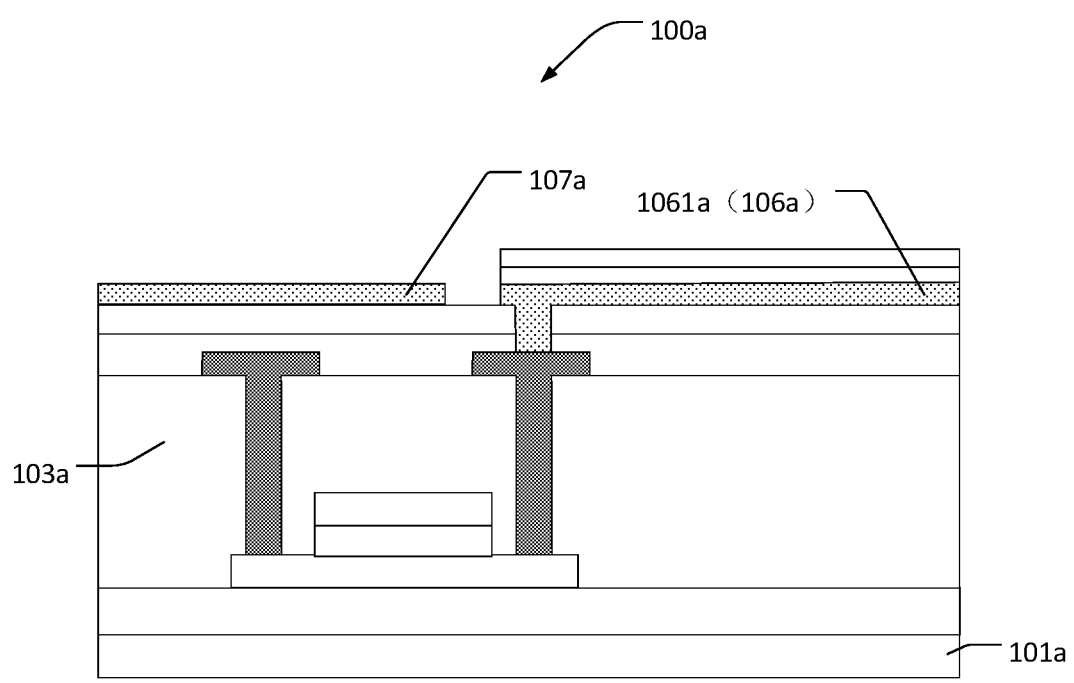
FIG. 8 is a schematic structural view of a steps S45) to a step S47) of a display panel manufacturing method of another embodiment provided by the present invention.

Material of the light absorbing layer 107a comprises indium tin oxide. The first transparent electrode layer 1061a and the light absorbing layer 107a are disposed in a same layer (with reference to FIG. 8).

The light absorbing layer 107a and the first transparent electrode layer 1061a are manufactured in the same layer such that an individual process for manufacturing the light absorbing layer is not required.

With reference to FIG. 3, the present invention display panel 100a can acquire the light absorbing layer 107a without having additional processes.

To obtain the display panel 100a of the present invention, the present invention also provides a display panel manufacturing method of another embodiment to manufacture the display panel 100a.

The display panel manufacturing method provided by another embodiment of the present invention comprises a step S1) to a step S8) as follows.

The step S1) comprises providing an underlay substrate 101a. The underlay substrate 101a comprises a displaying region 110a and a non-displaying region 120a.

The step S2) comprises forming a thin film transistor layer 103a, which corresponds to the non-displaying region 120a, on the underlay substrate 101.

Figure 4:
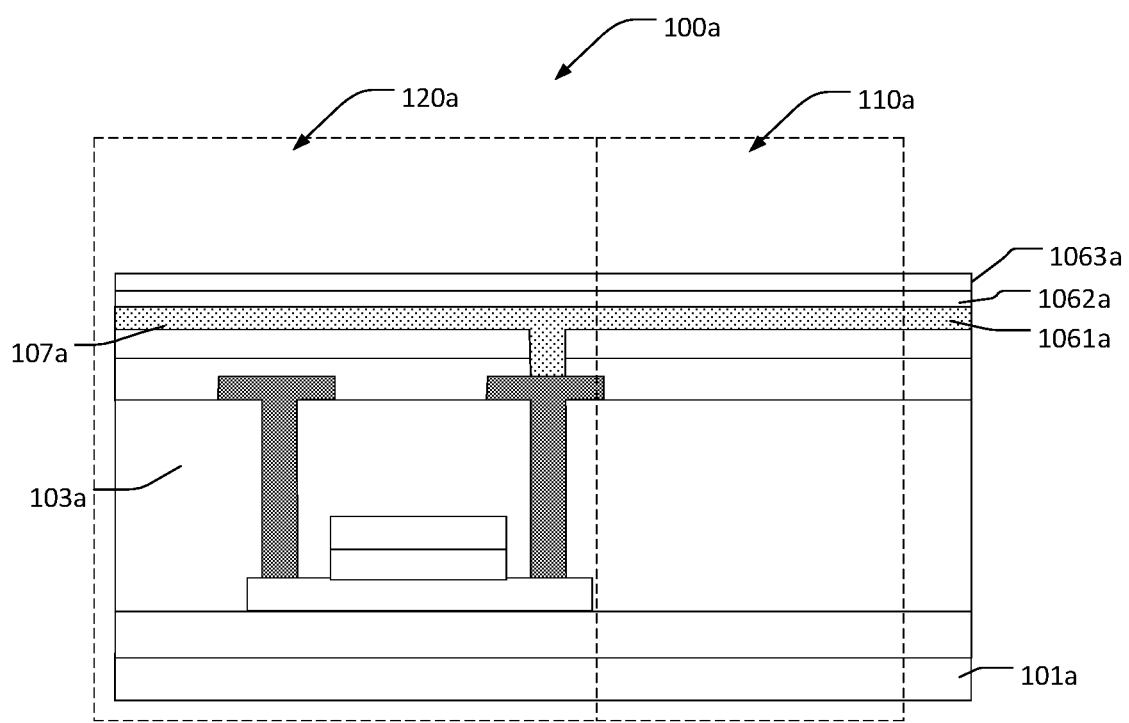
FIG. 4 is a schematic structural view of a step S3) of a display panel manufacturing method of another embodiment provided by the present invention.
Figure 5:
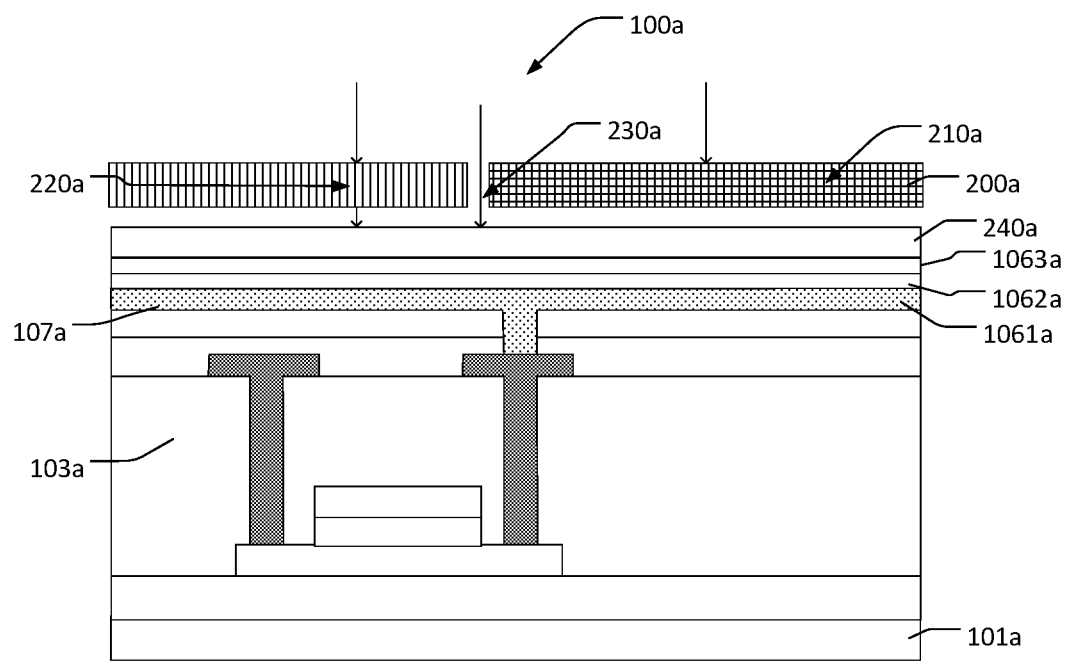
FIG. 5 is a schematic structural view of a step S41) and a step S42) of a display panel manufacturing method of another embodiment provided by the present invention.
Figure 6:
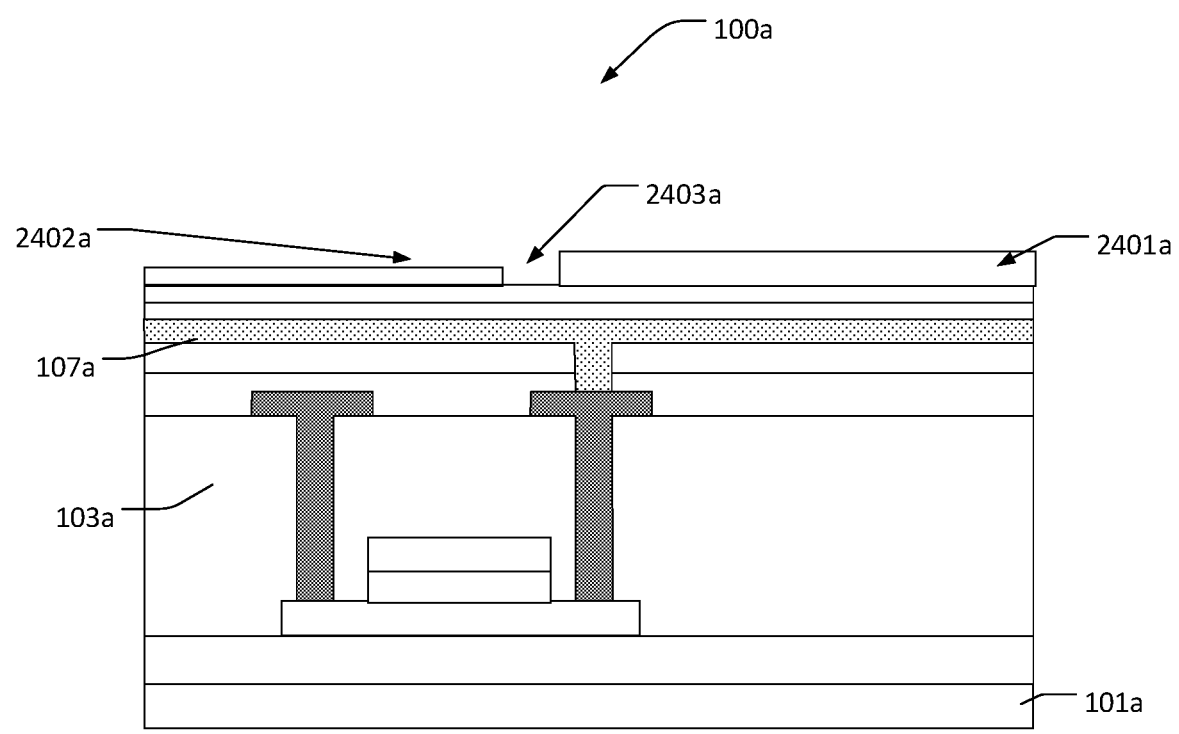
FIG. 6 is a schematic structural view of a step S43) of a display panel manufacturing method of another embodiment provided by the present invention.
Figure 7:
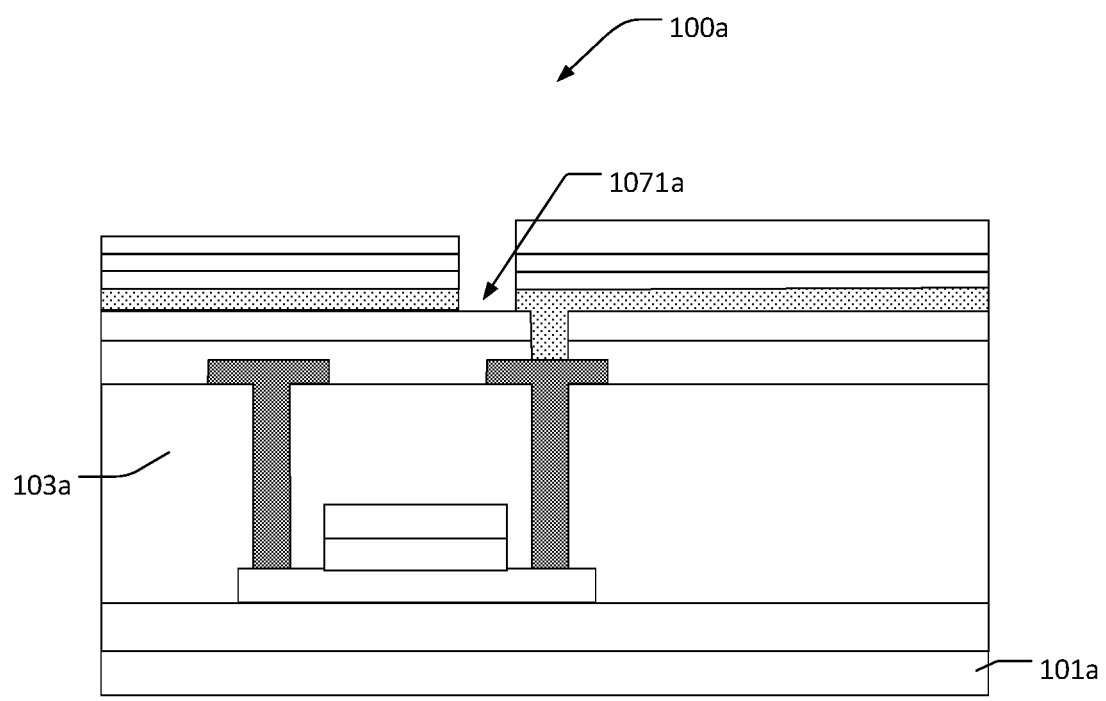
FIG. 7 is a schematic structural view of a step S44) of a display panel manufacturing method of another embodiment provided by the present invention.

The step S3), with reference to FIG. 4, comprises sequentially depositing a light absorbing layer 1061a, a metal layer 1062a, and a second transparent electrode layer 1063a on the thin film transistor layer 103a.

The step S4), with reference to FIGS. 5 to 8, comprises patterning the light absorbing layer 1061a, the metal layer 1062a, and the second transparent electrode layer 1063a by using a semi-exposure technique pattern to form a first electrode 106a in the displaying region, and to form an interval 1071a in the light absorbing layer 1061a. The interval 1071a is defined between the displaying region 110a and the non-displaying region 120a;

The step S4) comprises a step S41) to a step S47).

The step S41) comprises providing a halftone mask plate 200a, The halftone mask plate 200a comprises a fully through hole 230a, a semi-light transmissive region 220a, and an opaque region 210a. The fully through hole 230a is defined between the semi-light transmissive region 220a and the opaque region 210a. The opaque region 210a corresponds to the displaying region 110a. The semi-light transmissive region 220a corresponds to the non-displaying region 120a.

Light can completely extend through the fully through hole 230a and partially extend through the semi-light transmissive region 220a, but would not extend through the opaque region 210a.

The step S42) comprises coating a photoresist layer 240a on the second transparent electrode layer 1063a.

The step S43) comprises exposing and developing the photoresist layer 240a to acquire a first electrode pattern 2401a, a light absorbing layer pattern 2402a, and an intervening pattern 2403a by the halftone mask plate 200a.

The first electrode pattern 2401a and the light absorbing layer pattern 2402a are photoresists not removed by a developer. The first electrode pattern 2401a corresponds to the opaque region 210a, and the light absorbing layer pattern 2402a corresponds to the semi-light transmissive region 220a. by disposing regions with different light transmittances on the mask plate, the first electrode pattern 2401a and the light absorbing layer pattern 2402a are separated after the exposure and development.

The intervening pattern 2403a is gaps in the first electrode pattern 2401a and the light absorbing layer pattern 2402a. Because light entirely irradiates in the gaps, the photoresists in those regions are removed.

The step S44) comprises etching the light absorbing layer 1061a, the metal layer 1062a, and the second transparent electrode layer 1063a corresponding to the intervening pattern 2403a to form an interval 1071a. The interval 1071a separates the light absorbing layer 107a from the first electrode 106a, in other words, it separates the light absorbing layer in the displaying region 110a from the light absorbing layer in the non-displaying region 120a.

The step S45) comprises removing the light absorbing layer pattern 2402a, and etching the metal layer and the second transparent electrode layer in the non-displaying region 120 to expose the light absorbing layer in the non-displaying region 120a.

The step S46) removing the first electrode pattern 2401a and the light absorbing layer, the metal layer, and the second transparent electrode layer in the displaying region 110a to form the first electrode 106a (has the same structure and position as those of the first electrode 106 of the former embodiment).

The step S5) comprises forming a pixel definition layer 108a on the light absorbing layer 107a.

The step S6) comprises forming a through hole, which corresponds to the displaying region 110a, in the pixel definition layer 108a.

The step S7) comprises etching a portion of the light absorbing layer 107a corresponding to the through hole such that the first electrode 106a is exposed in the through hole.

The step S8) comprises vapor-depositing an organic light emitting layer 1013a on the first electrode 106a in the first through hole 1081.

The display panel manufacturing method of another embodiment provided by the present invention, compared to a former embodiment, has no additional manufacturing processes for manufacturing the light absorbing layer 107a, but forms the first electrode 106a and an interval 1071a by the semi-exposure technique. The interval 1071a separates the light absorbing layer 107a in the non-displaying region from the first electrode 106a.

Specifically, by sequentially depositing the light absorbing layer 1061a, the metal layer 1062a, and the second transparent electrode layer 1063a on the thin film transistor layer 103a and by employing the halftone mask plate to perform the exposure, development, and etching technologies, the first electrode 106a and the light absorbing layer 107a are formed at one time. In other words, the triple layer structure of the light absorbing layer, the metal layer, and the second transparent electrode layer are retained in the displaying region 110a to form the first electrode 106a with the same structure and position as those of the former embodiment. Only the light absorbing layer 107a is retained in the non-displaying region 120a, the light absorbing layer 107a can effectively lower emission of incident visible light, and simultaneously can mitigate damages of external light to the display device.

The technical scope of the present invention is not limited to the contents of the specification, a person of ordinary skill in the art can perform various variants and modifications to the embodiment without departing from the technical idea of the present invention. The variants and modifications shall be within the scope of the present invention.

What is claimed is:

1. A display panel manufacturing method, comprising:
   providing an underlay substrate, wherein the underlay substrate comprises a displaying region and a non-displaying region;
   forming a thin film transistor layer, which corresponds to the non-displaying region, on the underlay substrate;
   sequentially depositing a light absorbing layer, a metal layer, and a second transparent electrode layer on the thin film transistor layer;
   patterning the light absorbing layer, the metal layer, and the second transparent electrode layer by using a semi-exposure technique to form a first electrode in the displaying region, and to form an interval in the light absorbing layer, wherein the interval is defined between the displaying region and the non-displaying region;
   forming a pixel definition layer on the light absorbing layer;
   forming a first through hole, which corresponds to the displaying region, on the pixel definition layer;
   etching a portion of the metal layer and the second transparent electrode layer corresponding to the first through hole such that the first electrode is exposed in the first through hole; and
   vapor-depositing an organic light emitting layer on the first electrode in the first through hole.

2. The display panel manufacturing method as claimed in claim 1, wherein
   the step of patterning the light absorbing layer, the metal layer, and the second transparent electrode layer by using the semi-exposure technique, specifically comprises:
   providing a halftone mask plate, wherein the halftone mask plate comprises a fully through hole, a semi-light transmissive region, and an opaque region;
   coating a photoresist layer on the second transparent electrode layer;
   exposing and developing the photoresist layer by the halftone mask plate to acquire a first electrode pattern, a light absorbing layer pattern, and an intervening pattern;
   etching the light absorbing layer, the metal layer, and the second transparent electrode layer corresponding to the intervening pattern to form an interval;
   removing the light absorbing layer pattern, and etching the metal layer and the second transparent electrode layer in the non-displaying region to expose the light absorbing layer in the non-displaying region; and
   removing the first electrode pattern to acquire the first electrode.

* * * * *